US006737911B2

(12) United States Patent
Ausserlechner

(10) Patent No.: US 6,737,911 B2
(45) Date of Patent: May 18, 2004

(54) FILTER

(75) Inventor: Udo Ausserlechner, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/013,289

(22) Filed: Dec. 10, 2001

(65) Prior Publication Data
US 2002/0070795 A1 Jun. 13, 2002

(30) Foreign Application Priority Data
Dec. 8, 2000 (DE) .......................... 100 61 235

(51) Int. Cl.⁷ ................................................ H03K 5/00
(52) U.S. Cl. ......................... 327/553; 327/552; 333/172
(58) Field of Search .............................. 327/552, 553, 327/558; 333/172, 173

(56) References Cited

U.S. PATENT DOCUMENTS 3,755,749 A * 8/1973 Van Ryswyk et al. ...... 327/553
4,509,021 A * 4/1985 Van Uden ................... 330/282
4,783,635 A   11/1988 Sevastopoulos ............. 330/107
5,107,220 A * 4/1992 Andoh .......................... 327/41

FOREIGN PATENT DOCUMENTS

DE   37 23 778 A1   1/1988
JP   403065812   *  3/2001   ............. 327/552

OTHER PUBLICATIONS

Tietze/Schenk: "Halbleiter–Schaltungstechnik" [semiconductor circuit technology], Springer–Verlag, Berlin, 8th ed., 1986, pp. 27, 99–101, 376–381.

* cited by examiner

Primary Examiner—Dinh T Le
(74) Attorney, Agent, or Firm—Laurence A. Greenberg; Werner H. Stemer; Ralph E. Locher

(57) ABSTRACT

The adaptive filter can be realized with a very low circuitry outlay, as a result of which the adaptive filter for the first time becomes practical for many applications. In particular, the area required by the filter is small since the large time constants that are necessary for many applications can be realized in a simple manner by the control circuit. The adaptive filter is suitable in particular for "mixed signal ASICS", in which the required preconditions for the control circuit are already present, so that the control circuit can be realized just by means of corresponding wiring.

19 Claims, 6 Drawing Sheets

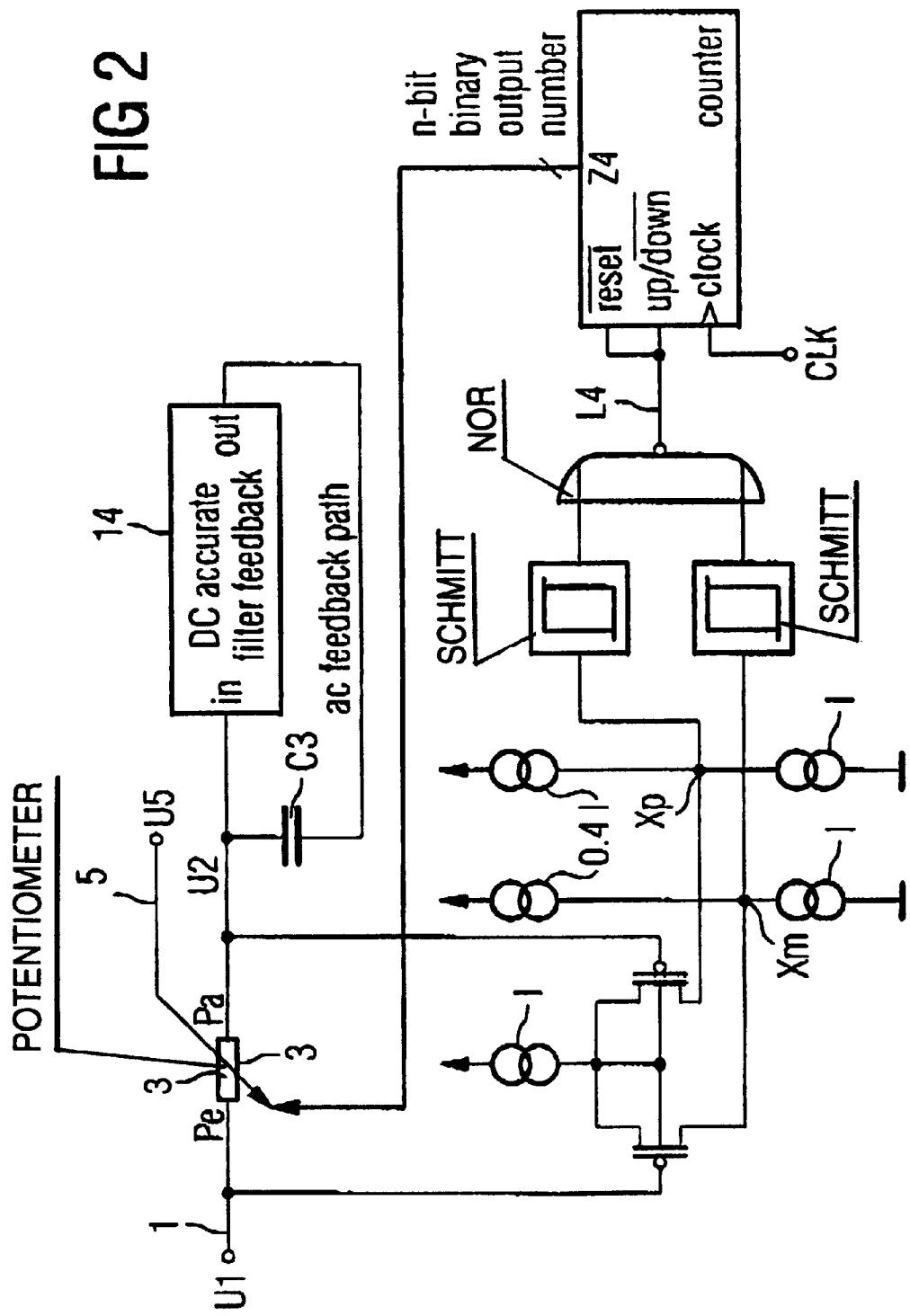

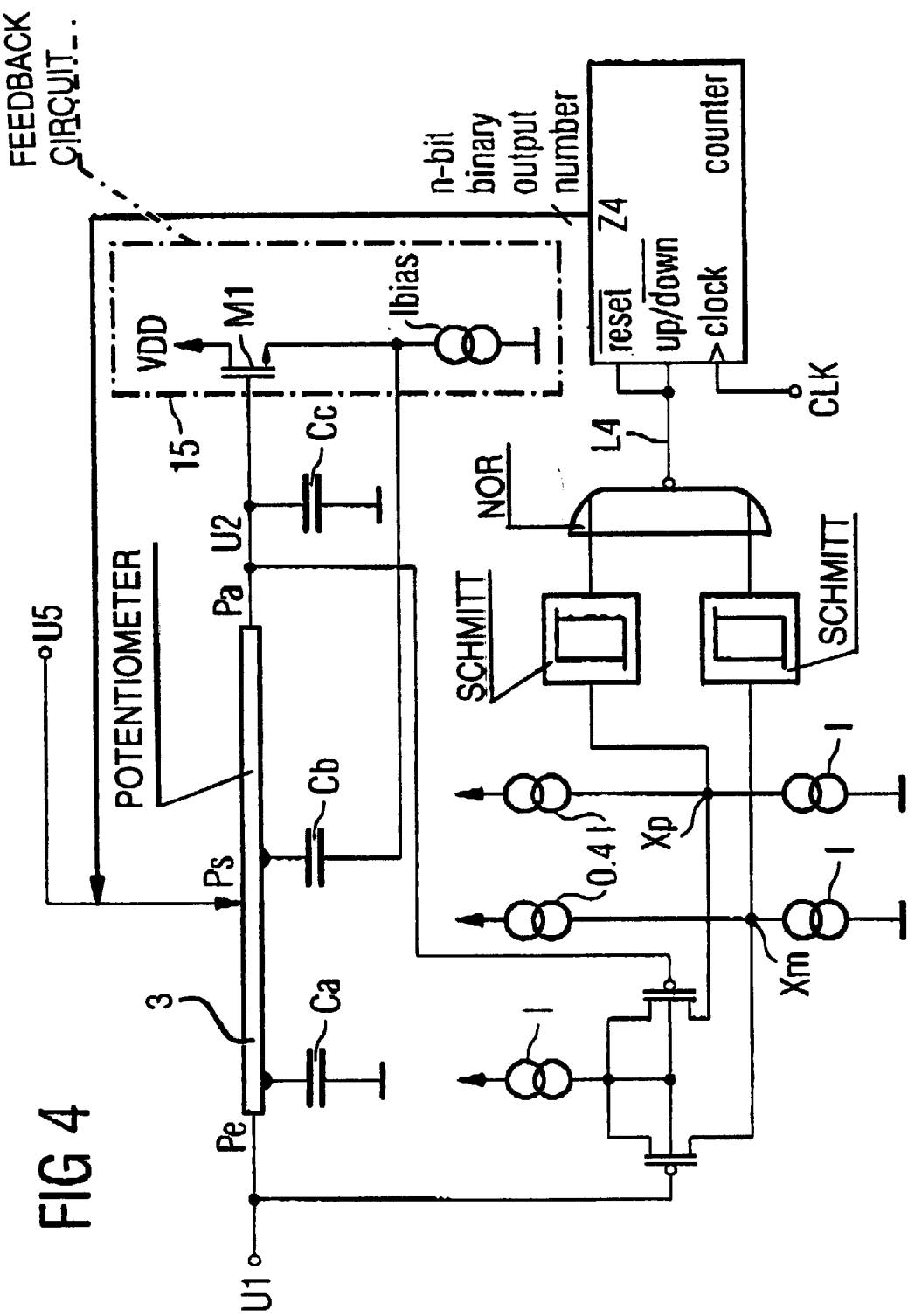

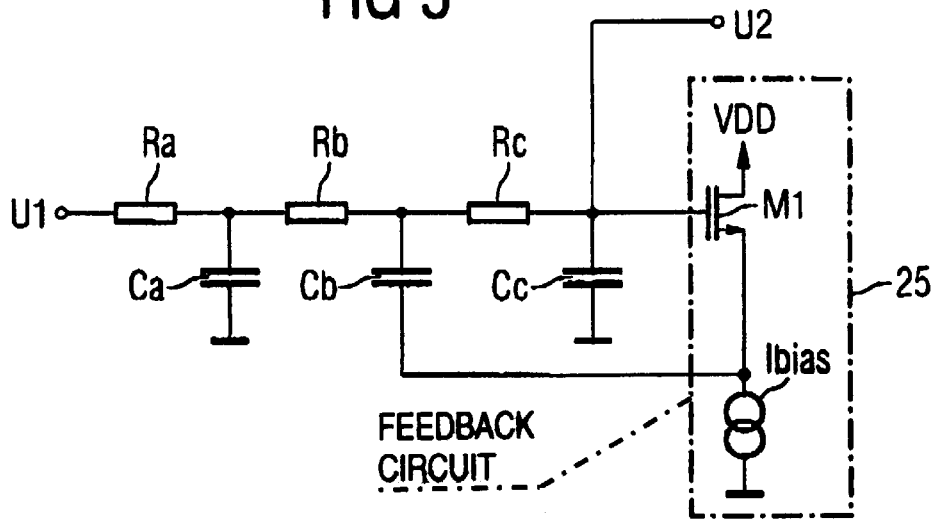
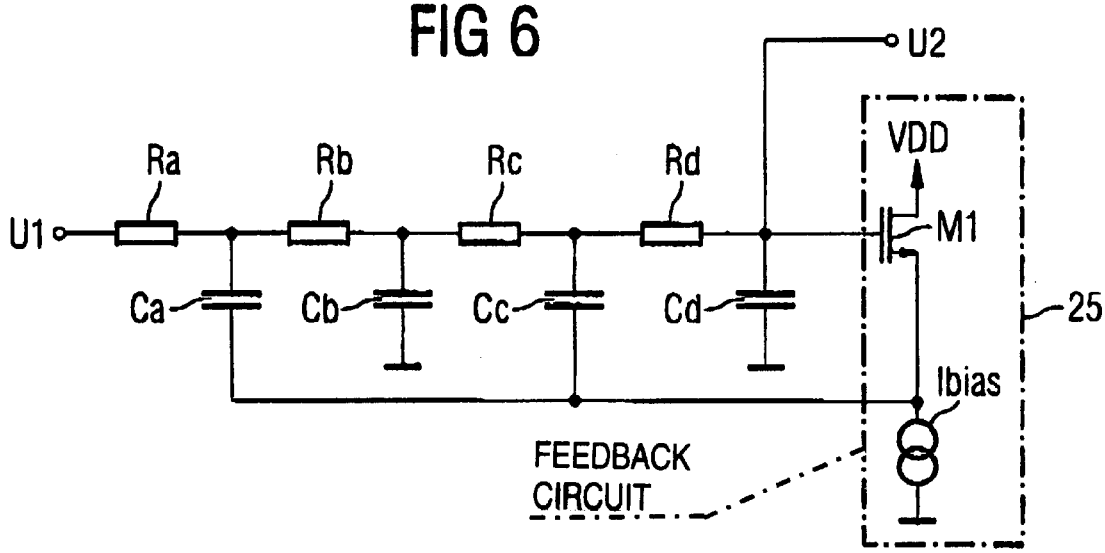

FILTER

BACKGROUND OF THE INVENTION

Field of the Invention

The present invention relates to filters that are required for signal processing. The present invention relates, in particular, to an adaptive filter that is suitable for analog signal processing. Furthermore, the present invention relates to a low-pass filter.

An output signal on which the smallest possible noise voltage is superposed is demanded of analog sensors, for example analog magnetic field sensors. Furthermore, the output signal should follow rapid changes in the sensor input quantity with the shortest possible dead time. Unfortunately, these two requirements conflict with one another.

The requirement for a small noise power can generally be realized only by band limiting. In many analog sensors, this involves low-pass filtering since most of the physical quantities (temperature, magnetic field, pressure, acceleration, etc.) are of practical interest only for frequencies from 0 Hz (=temporally constant physical measurement quantity) up to a maximum frequency fmax, which generally lies between 100 Hz and 100 kHz. In this case, the low-pass filter is designed to transfer all of the spectral components in the useful frequency band from 0 Hz to fmax, as much as possible without distortion, from the input to the output. By contrast, all of the frequencies above fmax are attenuated to the greatest possible extent.

In this case, using the transfer function $H(s)=Ua(s)/Ue(s)$ ($s=\sigma+j\omega$ where $\omega=2\pi f$; f ... frequency; j ... imaginary unit; Ua, Ue ... Laplace transform of the output signal/input signal of the low-pass filter), undistorted transfer is understood to be obtained, depending on the application, when the amplitude of the transfer function is constant as much as possible, or when the phase shift $\phi=arg(H(j\omega))$ of the output signal with respect to the input signal is constant, as much as possible, and is as small as possible, or when the input signal has the smallest possible group delay $Tgr=d\phi/d\omega$ though the low-pass filter. Accordingly, different filter types, such as for example, Butterworth, Chebyshev, Bessel, etc, result in different optimization criteria result being taken into account for the transfer function of the filter.

What is common to all of the filters, however, is that the signal is delayed to a greater extent, the greater the narrowband nature of the low-pass filter. Thus, if the useful signal band is embodied such that it has a highly narrowband nature, then although this minimizes the noise power in the output signal, the dead time nonetheless rises simultaneously. The dead time is that temporal offset with which the sensor output reacts to a rapid change in the physical measurement quantity.

In particular in the case of integrated circuits which are produced in large numbers, a filter which is automatically adapted to the respective application is desirable. If the input quantity only changes very slowly, then the filter should have a highly narrowband nature and thereby minimize the noise power in the output signal. If the input quantity changes to a great extent and/or rapidly, however, then the low-pass filter should step up its cut-off frequency accordingly, so that the reaction time of the output signal is minimized.

For adaptive filters of this type, what are particularly unpleasant are sinusoidal input signals which change relatively rapidly at the zero crossing, but have practically no change during the reversal times. At these reversal times, the filter must not change its cut-off frequency because that would mean a considerable distortion (harmonic distortion factor) of the output signal. For the filter this means that, in the event of a slowing down of the input signal, it must not react immediately with a reduction of the cut-off frequency, but rather must observe the input signal over a longer period of time. Only if the input signal remains unchanged for a relatively long time is the cut-off frequency of the filter permitted to be reduced.

By way of example, if a 50 Hz signal is to be transferred without distortion, then this observation time period must at least be longer than the shallow crests of the 50 Hz signal (that is approximately 1/50/4 seconds=5 ms). However, such large time constants are virtually impossible to realize economically using integrated technology since they require large capacitances, and consequently, a great deal of chip area. Therefore, large filter time constants with a short dead time are generally realized by adaptive digital filters. However, if an analog signal has to be digitized specially for this, then this outlay is worthwhile only in a small number of cases.

SUMMARY OF THE INVENTION

It is accordingly an object of the invention to provide an adaptive filter and a low-pass filter which overcome the above-mentioned disadvantages of the prior art apparatus of this general type.

In particular, it is an object of the invention to provide an adaptive filter with a large time constant that requires only a small area and which can be used without digitizing the input signal. Furthermore, it is an object of the invention to provide a low-pass filter that likewise requires only a small area.

With the foregoing and other objects in view there is provided, in accordance with the invention, an adaptive filter for analog filtering a signal. The adaptive filter includes: a signal input; a signal output; and at least one potentiometer having a first terminal, a second terminal, and a third terminal. The second terminal is for subdividing the potentiometer into two series-connected resistors. The first terminal is connected to the signal input, and the second terminal is connected to the signal output. The adaptive filter also includes: at least one capacitor connected in series with the potentiometer via the third terminal of the potentiometer; and at least one control circuit for controlling the subdividing of the potentiometer into the two series-connected resistors.

The adaptive filter provides the advantage that it can be realized with a very low amount of circuitry, as a result of which, the adaptive filter becomes practical for the first time for many applications. In particular, the area required by the filter is small since the large time constants that are necessary for many applications can be realized in a simple manner by the control circuit. The adaptive filter is suitable in particular for "mixed signal ASICS", in which the requirements for the control circuit have already been specified, so that the control circuit can be realized just by means of corresponding wiring.

The adaptive filter furthermore has the advantage that it can be used without digitizing the input signal. Moreover, the passive realization of the adaptive low-pass filter precludes an unavoidable offset error as caused by conventional active filters.

The adaptive filter includes a potentiometer having a second terminal which can be used to subdivide the potentiometer into two series-connected resistors. In this case, the limiting cases can also arise where the second terminal corresponds either to the first terminal or to the third terminal. However, the potentiometer of the adaptive filter can also be designed in such a way that the second terminal cannot be set exactly to the first and/or third terminal, so that the filter always has a finite bandwidth. Moreover, it may be advantageous, under certain circumstances, that even in the case of a narrowband signal in the signal path, a higher cut-off frequency can nevertheless be set than would be possible if the second terminal were set to the third terminal.

The potentiometer of the adaptive filter can also be designed in such a way that only two positions can be set for the second terminal, one position corresponding to a low cut-off frequency and the other position corresponding to a higher cut-off frequency. A changeover is then made between these two cut-off frequencies in accordance with the control circuit.

In accordance with an added feature of the invention, the control circuit has an evaluation circuit that forms the magnitude of the difference between the voltage at the first terminal of the potentiometer and the voltage at the third terminal of the potentiometer and compares it with a threshold voltage. This difference is a good measure of the changes in is input quantity.

In accordance with an additional feature of the invention, the control circuit has a counter, in particular an up/down counter. In this case, it is preferred if the counter can be reset to an initial value by a signal. In this case, it is particularly preferred if the counter is controlled by a clock signal and the counter can be reset to an initial value by a signal, asynchronously with the clock signal. Furthermore, it is preferred if an assessment circuit is provided, which monitors the resetting of the counter.

In accordance with another feature of the invention, the potentiometer includes a multiplicity of series-connected resistors. Furthermore, switches are provided, which can be used to shift the second terminal of the potentiometer between the resistors. This results in a simple realization of a potentiometer which can be driven by the counter via a decoder.

In accordance with a further feature of the invention, a feedback circuit is provided, which is connected to the capacitor to thereby form a filter of any desired order. In this case, it is particularly preferred if the feedback circuit contains a transfer element with a predetermined transfer function.

In accordance with a further added feature of the invention, at least two capacitors are provided, which are connected to the potentiometer. In this case, it is particularly preferred if a feedback circuit is provided, which is connected to at least one of the capacitors, thereby forming a filter of a predetermined order. Furthermore, it is preferred if the feedback circuit contains at least one transistor connected up as a source follower. The control terminal of the transistor is connected to the third terminal of the potentiometer. In this case, it is particularly preferred if the feedback circuit contains at least one transistor which has a gain of about 1 and/or which decouples the capacitor that is connected to the feedback circuit from the third terminal of the potentiometer.

With the foregoing and other objects in view there is provided, in accordance with the invention, a low-pass filter for analog filtering a signal. The low-pass filter includes: a signal input; a signal output; and an RC network including at least two resistors and at least two capacitors. The RC network provides a connection between the signal input and the signal output. The connection includes only the resistors. The low-pass filter also includes a feedback circuit connected to at least one of the capacitors to thereby define a predetermined order of the filter. The feedback circuit has a transistor connected as a source follower, and the transistor has a control terminal connected to the signal output.

The low-pass filter can be realized with a low circuitry outlay. In particular, the area required by the low-pass filter is small.

In accordance with a further feature of the invention, the transistor of the feedback circuit has a gain of about 1. Furthermore, it is preferred if the transistor decouples the capacitor that is connected to the feedback circuit from the signal output.

Other features which are considered as characteristic for the invention are set forth in the appended claims.

Although the invention is illustrated and described herein as embodied in a filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 shows an embodiment of a filter of any desired order;

FIG. 4 shows an embodiment of a third-order filter;

FIG. 5 shows a first embodiment of a low-pass filter; and

FIG. 6 shows a second embodiment of the low-pass filter.

DESCRIPTION OF THE PREFERRED EMBODIMENTS

Figure 1A:
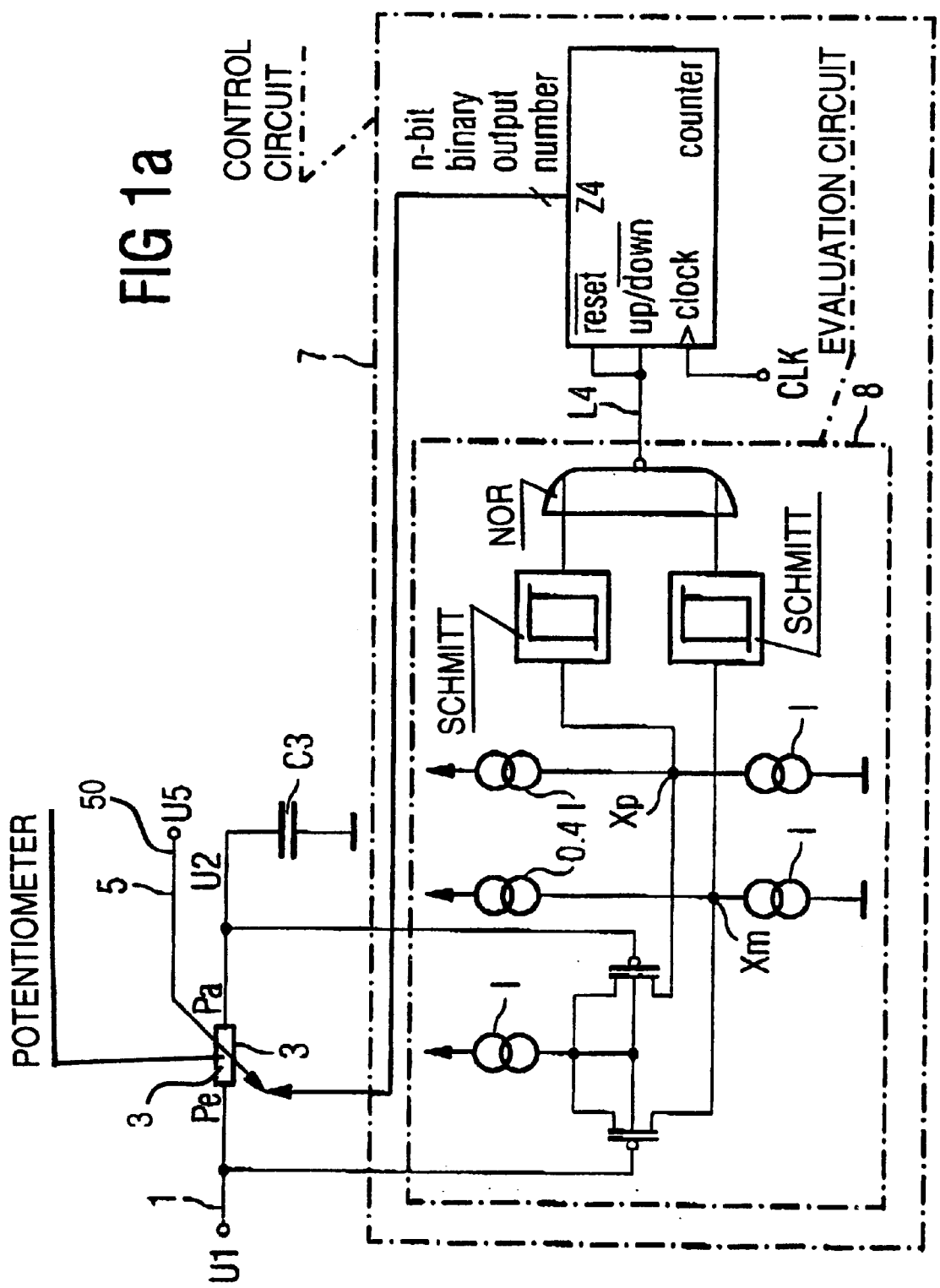
FIG. 1a shows a first embodiment of a first-order filter.

Referring now to the figures of the drawing in detail and first, particularly, to FIG. 1a thereof, there is shown a first embodiment of an inventive filter. The filter includes a signal input 1 and a signal output 50. In this case, the signal input 1 corresponds to the first terminal Pe of a potentiometer 3, while the signal output 50 corresponds to the second terminal 5 of the potentiometer 3. In this case, the second terminal of the potentiometer is designed in such a way that the second terminal 5 (so-called "slider") can be used to subdivide the potentiometer 3 into two series-connected resistors. Via a third terminal Pa, the potentiometer 3 is connected in series with a capacitor C3. Furthermore, the filter has a control circuit 7, which can be used to control the subdivision of the potentiometer 3 into two series-connected resistors by means of the second terminal. This results in simple regulation of the time constant of the adaptive filter.

If the resistance between the second terminal 5 and the third terminal Pa is designated by k*P3 and the resistance between the first terminal Pe and the second terminal 5 is designated by (1−k)*P3, then the Laplace transform of the output signal U5 at the signal output 50 turns out as:

$$U5(s)=U1(s)*(1/(1+\tau_3 s)+k*\tau_3 s/(1+\tau_3 s)) \quad (1)$$

where $\tau_3 = P3 \ast C3$.

Figure 1B:
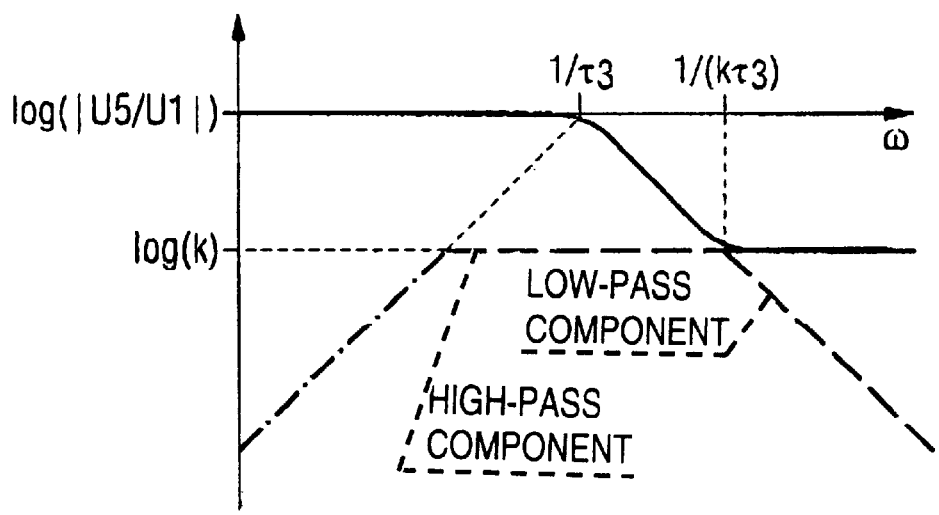
FIG. 1b shows a Bode diagram.

As can be seen from equation (1), the output signal U5 is a superposition of a low-pass-filtered signal (first addend) and a high-pass-filtered signal (second addend). Both of the filter components have the same cut-off frequency $fg3 = \frac{1}{2}\pi\tau_3$ and the high-pass filter component is attenuated with the factor k ($k \leq 1$). For k=0, U5 is limited to the minimal useful bandwidth. For k=1, the high-pass and the low-pass filter components supplement one another to give the transfer function=1, so that U5=U1, that is to say no filtering is performed. The Bode diagram of the filter transfer function is illustrated in FIG. 1b.

Figure 1C:
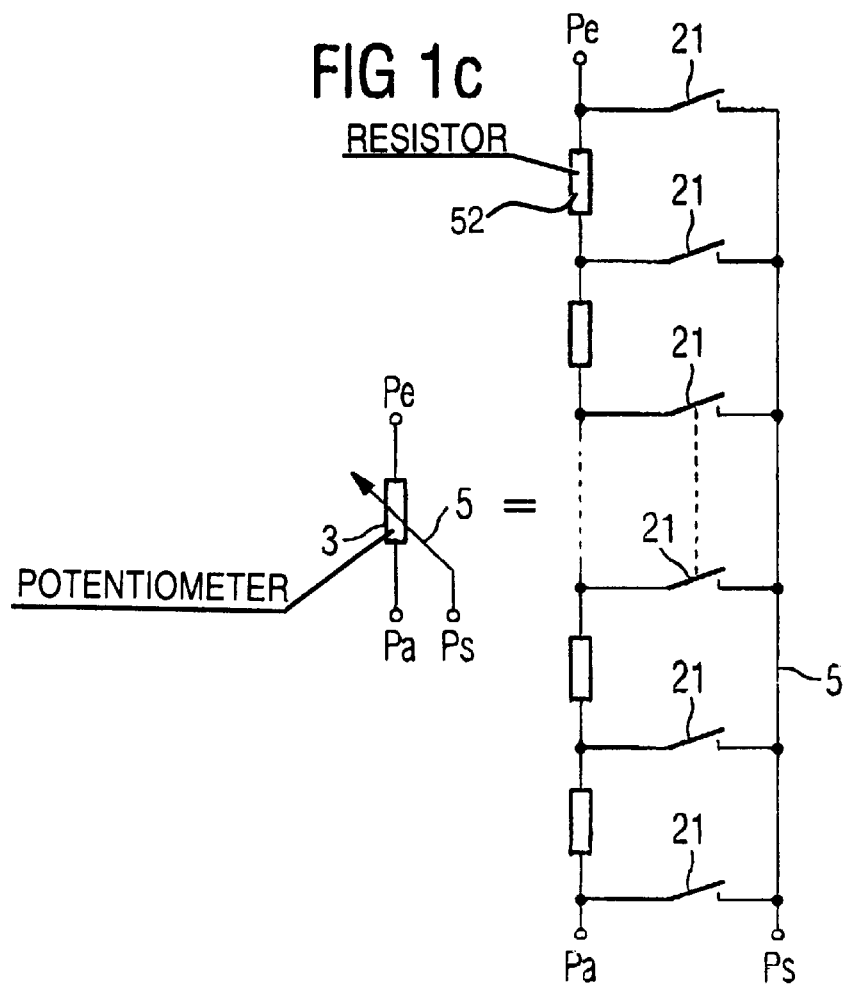
FIG. 1c shows an embodiment of a potentiometer.

Using integrated technology, the potentiometer is preferably embodied as a resistor chain (FIG. 1c), in which case the potential of each circuit node between two adjacent resistors 52 can be switched through to the output by means of a CMOS switch 21. The passive realization of the adaptive low-pass filter also precludes any unavoidable offset error as is caused by conventional active filters. Possible glitches in the output signal can be eliminated by driving the CMOS (Complementary Metal Oxide Semiconductor) switches with overlapping clock signals. Moreover, switching transients are attenuated by the band limiting of the downstream electronics (e.g. output amplifier for driving off-chip load capacitances and/or resistances).

The control circuit 7 (FIG. 1a) is provided for controlling the setting of the second terminal 5 at the potentiometer. The control circuit 7 includes an evaluation circuit 8, which forms the difference between the voltage at the first terminal Pe of the potentiometer 3 and the voltage at the third terminal Pa of the potentiometer 3 and compares it with a threshold voltage. The result of this comparison is fed to a terminal L4 of an up/down counter Z4. The evaluation circuit 8 includes two P-MOS transistors, a plurality of current sources I and also 0.4I, two Schmitt triggers and a NOR gate. The method of operation of this evaluation circuit 8 is adequately known in the prior art and is not explained any further here.

The evaluation circuit 8 supplies a logic HIGH level to L4 if the magnitude of U1–U2 is less than a set threshold Umin, otherwise a LOW level is present at the output L4. This digital output L4 controls the counting direction of an up/down counter Z4. If L4 is HIGH, then the counter counts up; it counts down in the case of LOW. The output of the counter is decoded by a decoder (not shown) and drives the CMOS switches 21 shown in FIG. 1c.

The higher the binary number of the counter Z4, the smaller k becomes, i.e. the nearer the second terminal of the potentiometer is brought to the first terminal of the potentiometer. If the binary number of the counter Z4=0, then k=1, i.e. the slider of the potentiometer is at the left-hand stop Pe, so that the signal U1 is passed through to the output U5 of the adaptive filter without any delay. For Z4=Zmax, the CMOS switch on the right-hand side of the potentiometer Pa is activated (k=0), so that the complete low-pass filter P3, C3 is inserted into the signal path. The counter Z4 is of an overflow-proof design in this example. When counting down, the counter output no longer changes as soon as the binary number of the counter Z4=0. When counting up, the counter output no longer changes as soon as the binary number of the counter Z4=Zmax.

The counter is driven by a slow clock CLK (e.g. frequency fCLK=1 kHz), with the result that the adaptive filter reduces its cut-off frequency only very slowly (i.e. the filter relaxes slowly; this corresponds to a large time constant). Preferably, the signal L4 is also applied to the RESET input of the counter Z4, so that the binary number of the counter Z4 is reset to zero as soon as L4=LOW. Consequently, the adaptive filter reacts immediately (also asynchronously with respect to the slow clock CLK) to rapid input voltage jumps U1, as soon as the latter are greater than the threshold Umin. As soon as the input signal U1 has settled again, the cut-off frequency of the filter decreases, however, only slowly synchronously with the clock CLK. The filter requires the time Zmax/fCLK in order to reduce its cut-off frequency from infinity to $f3min = fg3 = 1/(2\pi\tau_3) = 1/(2\pi P3C3)$ The major advantage of this circuit is that the outlay for circuitry is reduced to a minimum, as a result of which the adaptive filter becomes practical for the first time for many applications. The filter can be used in particular in so-called "Mixed-Signal ASICS" (Application Specific Integrated Circuits), in which clock driving is already present. These ASICs are usually equipped with a programming interface in which an up/down counter is required. When the programming is ended, this counter can be used in the adaptive filter, so that it is not necessary to use additional chip area.

If a fast reaction time is not demanded of the filter, then the connection—shown in FIG. 1a—between the terminal L4 and the reset terminal of the counter Z4 can be omitted. Accordingly, the logic HIGH/LOW signal present at the terminal L4 merely controls the counting direction, and no longer controls the reset of the counter Z4.

Improved interference immunity can be achieved by not allowing the terminal L4 to directly control the reset terminal of the Counter Z4, but rather by inserting a digital assessment circuit AC between the terminal L4 and the reset terminal of the counter Z4. This digital assessment circuit AC assesses the temporal sequence of the L4 values and controls the counting direction and/or counting speed in order to reset the counter depending on this assessment. In this way, it is possible to increase the resistance of the adaptive filter to momentary interference pulses by resetting the counter to a predetermined value only in the event of, for example, 10 successive LOW values at the terminal L4.

The clock control for this additional digital section is preferably of a high-frequency design (for example 1–10 MHz). The use of an additional assessment circuit AC also makes it possible to reduce the threshold 13 mm, since the probability that, in the event of successive, e.g. 10 values, at the terminal L4, all of the values will be LOW as a result of noise spikes is significantly lower than is the case when only one L4 value is taken into account.

FIG. 2 shows a further embodiment of the filter and this embodiment can be of any desired order. The filter shown in FIG. 2 is provided with a feedback circuit 14, which is connected to the capacitor C3, thereby forming a filter of any desired order. The feedback circuit 14 controls the capacitor C3 in such a way that capacitive currents are injected into the terminal Pa and compensate for residual high frequencies of U2.

Since the parameters of the low-pass filter, which are formed from the potentiometer 3 and the capacitor C3, do not change in a manner dependent on the setting of the second terminal, the signal U2 is always a greatly low-pass-filtered image of the input signal U1. Accordingly, a great and rapid change in the input signal can be identified using the threshold value circuit by comparing the present input signal with the previous image (U2).

Figure 3:
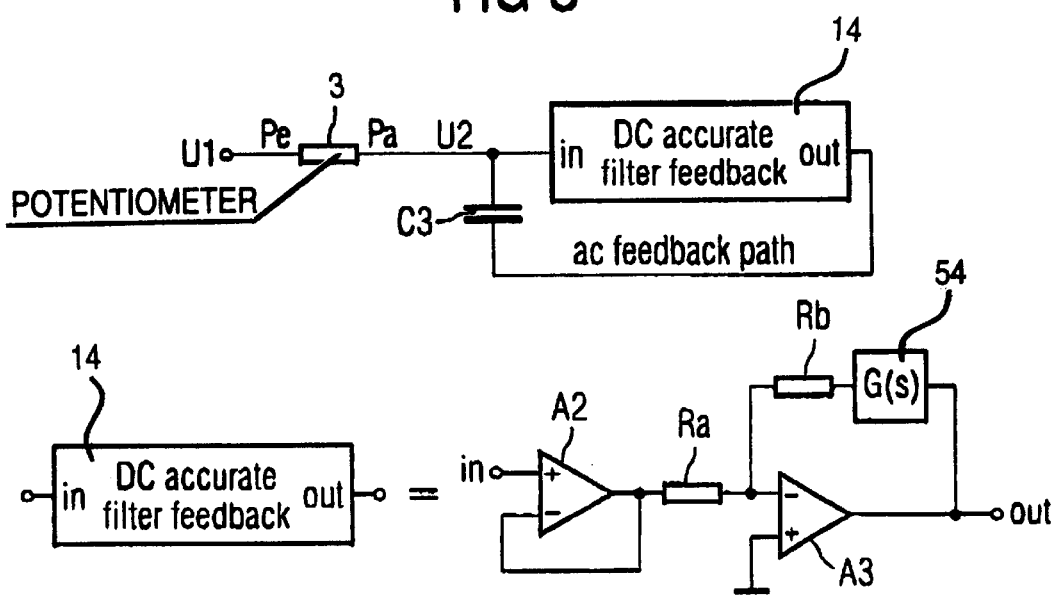
FIG. 3 shows the feedback circuit from FIG. 2.

FIG. 3 shows the active feedback circuit that is disclosed in U.S. Pat. No. 4,783,635 and this circuit is preferably used as the feedback circuit 14. In the case of this active feedback circuit, it is possible to realize an arbitrarily complicated transfer function G(s), with a transfer element 54 (FIG. 3) that uses continuous-time technology or, even better, that uses discrete-time technology (for example by means of so-called "switched capacitor filters"). Since no active amplifiers are inserted between U1 and U2 and the input of the feedback circuit does not take up any current, U2 is an exact image of U1 with regard to the DC voltage component. The input of the feedback circuit 14 does not take up any current because the input stage of the amplifier A2 shown in FIG. 3 is formed by MOS transistors. Consequently, it is not possible for a direct current to flow via the feedback circuit or via the capacitor C3 either. Accordingly, this filter can also be referred to as "offset-free".

Through the choice of a suitable transfer function G(s), it is possible to produce a very steep transfer function for the adaptive filter, which has a shallow curve profile in the passband and a very steep drop in the stop band. In integrated sensors, however, this type of filtering can already lead to a large area requirement and/or power demand, since two complete operational amplifiers A2 and A3 are required.

FIG. 4 shows an embodiment of a third-order filter. For this purpose, two further terminals are provided on the potentiometer 3, via which the potentiometer 3 is connected to a respective capacitor Ca and Cb. As before, a capacitor, now designated as Cc, is connected to the potentiometer 3 via the third terminal Pa of the potentiometer.

Furthermore, FIG. 4 shows a feedback circuit 15 having a transistor M1, for example a MOSFET or a JFET, and a current source Ibias. The transistor is connected as a so-called "source follower", its control terminal being connected to the third terminal Pa of the potentiometer 3. The source terminal of the transistor M1 is connected to the capacitor Cb, as a result of which the capacitor Cb is decoupled from the third terminal Pa of the potentiometer 3.

The filter that is shown in FIG. 4 forms a third-order adaptive filter which can again be referred to as a so-called "offset free" filter. Since the filter that is shown in FIG. 4 requires only a transistor M1 and a current source Ibias instead of two operational amplifiers, the filter that is shown in FIG. 4 can also be used in applications in which a small area requirement and/or power demand are required.

FIG. 5 shows a first embodiment of a low-pass filter. The low-pass filter includes a signal input U1 and a signal output U2. Furthermore, the low-pass filter includes an RC network composed of the resistors Ra, Rb, Rc and the capacitors Ca, Cb and Cc. In this case, the RC network is designed such that, between the signal input U1 and the signal output U2, a connection which has only resistors is present via the resistors Ra, Rb and Rc.

Furthermore the low-pass filter has a feedback circuit 25 with a transistor M1, for example a MOSFET or a JFET, and a current source Ibias. The transistor is connected as a so-called "source follower", its control terminal being connected to the signal output U2. The source terminal of the transistor M1 is connected to the capacitor Cb, as a result of which the capacitor Cb is decoupled from the signal output U2. Overall, a third-order low-pass filter is produced in this way.

FIG. 6 shows an embodiment of a fourth-order low-pass filter. For this purpose, an RC network is provided which is composed of the resistors Ra, Rb, Rc, Rd and the capacitors Ca, Cb, Cc and Cd. In this case, the RC network is again designed such that, between the signal input U1 and the signal output U2, a connection which has only resistors is present via the resistors Ra, Rb, Rc and Rd.

Furthermore, FIG. 6 shows a feedback circuit 25 again having a transistor M1, for example a MOSFET or a JFET and a current source Ibias. The transistor is connected up as a so-called "source follower", its control terminal being connected to the signal output U2. The source terminal of the transistor M1 is connected to the capacitors Ca and Cc, as a result of which the capacitors Ca and Cc are decoupled from the signal output U2.

The low-pass filter that is shown in FIG. 6 can form a fourth-order low-pass filter which can be referred to as a so-called "offset-free" filter.

I claim:

1. An adaptive filter for analog filtering a signal, comprising:
   a signal input;
   a signal output;
   at least one potentiometer having a first terminal, a second terminal, and a third terminal, said second terminal for subdividing said potentiometer into two series-connected resistors, said first terminal connected to said signal input, said second terminal connected to said signal output;
   at least one capacitor connected in series with said potentiometer via said third terminal of said potentiometer; and
   at least one control circuit for controlling the subdividing of said potentiometer into said two series-connected resistors in dependence on a signal at said signal input.

2. The filter according to claim 1, wherein:
   said control circuit includes an evaluation circuit that forms a magnitude of a difference between a voltage at said first terminal of said potentiometer and a voltage at said third terminal of said potentiometer; and
   said evaluation circuit compares the magnitude with a threshold voltage.

3. The filter according to claim 1, wherein said control circuit includes a counter.

4. The filter according to claim 3, wherein said counter is an up/down counter.

5. The filter according to claim 3, wherein said counter receives a signal for resetting said counter to an initial value.

6. The filter according to claim 5, comprising an assessment circuit for monitoring the resetting of said counter.

7. The filter according to claim 5, wherein:
   said counter is controlled by a clock signal; and
   the signal for resetting said counter to the initial value is asynchronous with the clock signal.

8. The filter according to claim 7, comprising an assessment circuit for monitoring the resetting of said counter.

9. The filter according to claim 1, comprising:
   switches;
   said potentiometer including a plurality of series-connected resistors; and
   said switches for shifting said second terminal of said potentiometer between said plurality of said series-connected resistors and thereby defining resistance values of said two-series connected resistors.

10. The filter according to claim 1, comprising:
    a feedback circuit connected to said capacitor;
    said feedback circuit setting a desired order of the filter.

11. The filter according to claim 10, wherein said feedback circuit includes a transfer element with a predetermined transfer function.

12. The filter according to claim 1, comprising at least two capacitors connected to said potentiometer.

13. The filter according to claim 12, comprising:
    a feedback circuit connected to at least one of said at least two capacitors to thereby set a predetermined order of the filter.

14. The filter according to claim 13, wherein:

said feedback circuit includes at least one transistor connected as a source follower; and said transistor has a control terminal connected to said third terminal of said potentiometer.

15. The filter according to claim 14, wherein:

one of said at least two capacitors is connected to said feedback circuit;

said transistor has a gain of about 1; and said transistor decouples the one of said capacitors, which is connected to said feedback circuit, from said third terminal of said potentiometer.

16. The filter according to claim 13, wherein:

one of said at least two capacitors is connected to said feedback circuit;

said transistor has a gain of about 1; and said transistor decouples the one of said capacitors, which is connected to said feedback circuit, from said third terminal of said potentiometer.

17. A low-pass filter for analog filtering a signal, comprising:

a signal input;

a signal Output;

an RC network including at least two resistors and at least two capacitors, said RC network providing a connection between said signal input and said signal output, said connection including only said resistors; and a feedback circuit connected to at least one of said capacitors, thereby defining a predetermined order of the filter;

said feedback circuit having a transistor connected as a source follower; and said transistor having a control terminal connected to said signal output.

18. The filter according to claim 17, wherein:

said transistor has a gain of about 1; and said transistor decouples the one of said capacitors, which is connected to said feedback circuit, from said signal output.

19. The filter according to claim 17, wherein said transistor decouples the one of said capacitors, which is connected to said feedback circuit, from said signal output.

* * * * *